(12) United States Patent
Doyle

(10) Patent No.: US 7,498,845 B1
(45) Date of Patent: *Mar. 3, 2009

(54) POWER SUPPLY SWITCHING AT CIRCUIT BLOCK LEVEL TO REDUCE INTEGRATED CIRCUIT INPUT LEAKAGE CURRENTS

(75) Inventor: James T. Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/880,648

(22) Filed: Jul. 23, 2007

Related U.S. Application Data

(63) Continuation of application No. 11/065,178, filed on Feb. 24, 2005, now Pat. No. 7,248,080.

(51) Int. Cl.
*H03K 19/096* (2006.01)
(52) U.S. Cl. ............ 326/95; 326/98; 326/93
(58) Field of Classification Search .......... 326/93, 326/95, 98
See application file for complete search history.

(56) References Cited

U.S. PATENT DOCUMENTS

| | | | |
|---|---|---|---|
| 6,433,584 B1 | 8/2002 | Hatae | |
| 6,501,300 B2 * | 12/2002 | Hatae | 326/93 |
| 6,646,511 B2 | 11/2003 | Canyon et al. | |
| 6,701,138 B2 | 3/2004 | Epperson et al. | |
| 6,757,526 B1 | 6/2004 | Sharp et al. | |
| 6,774,696 B2 * | 8/2004 | Clark et al. | 327/333 |
| 6,788,141 B2 | 9/2004 | Paul et al. | |
| 6,876,252 B2 * | 4/2005 | Kim et al. | 327/544 |
| 7,002,834 B2 | 2/2006 | Yokozeki | |
| 7,042,245 B2 | 5/2006 | Hidaka | |
| 7,098,689 B1 | 8/2006 | Tuan et al. | |
| 2004/0070427 A1 | 4/2004 | Miyagi | |
| 2004/0208046 A1 * | 10/2004 | Yokozeki | 365/145 |
| 2004/0263237 A1 * | 12/2004 | Kim et al. | 327/530 |

OTHER PUBLICATIONS

Dae Woon Kang et al., "A Low Power Methodology for Portable Electronics", Department of Electrical and Computer Engineering, Northeastern University.

* cited by examiner

*Primary Examiner*—Vibol Tan

(57) ABSTRACT

Leakage currents at IC inputs can be avoided while the IC is disabled by providing a switch that is responsive to deactivation of an enable input to isolate functional circuitry of the IC from one of the power supply nodes of the IC. This eliminates power supply current while the IC is disabled. Further unwanted current flow can be avoided while the IC is disabled by providing a switch that is responsive to the enable input for selectively connecting and disconnecting the base of a reference voltage transistor to and from the transistor's grounded collector, which collector is defined by the substrate of the IC. Disconnection of the base from the grounded substrate/collector eliminates base current and thus prevents emitter-to-collector current flow through the transistor when the IC is disabled.

20 Claims, 2 Drawing Sheets

POWER SUPPLY SWITCHING AT CIRCUIT BLOCK LEVEL TO REDUCE INTEGRATED CIRCUIT INPUT LEAKAGE CURRENTS

This application is a continuation of prior U.S. patent application Ser. No. 11/065,178 filed on Feb. 24, 2005 now U.S. Pat. No. 7,248,080.

TECHNICAL FIELD OF THE INVENTION

The present invention is generally directed to integrated circuits reducing leakage currents at the inputs of an integrated circuit (IC).

BACKGROUND OF THE INVENTION

In mobile data processing devices, for example portable and mobile telephones and computers, conservation of battery power is very important. Whenever the data processing circuitry within the device is not being used, it can often be disabled from operation, thereby permitting power savings. However, even with circuitry disabled, there can often remain the problem of leakage currents at the inputs of an integrated circuit device that contains the data processing circuitry. The greater the input leakage current while disabled, the greater the battery power consumption at a time when the device is not even being utilized. Moreover, in some mobile data processing devices, a given integrated circuit might actually be disabled for a large majority of the time that the device is in operation.

For example, some mobile data processing devices support wireless communications. Some wireless communication standards, for example GSM, support a wireless communication protocol known generally as time division multiple access (TDMA). In TDMA applications, the mobile data processing device actively communicates over the wireless communication interface only during predetermined portions of the time that the device is in operation. For example, in GSM, a given mobile device actively communicates via the wireless communication device only during one-eighth of its operating time. During the remaining seven-eighths of the time, a given device is inactive while other devices are using the wireless communication link. Accordingly, a TDMA device can realize significant savings in battery power by simply disabling all circuitry which supports wireless communications during the time that the device is not actively engaged in wireless communication.

FIG. 1 illustrates an example of a mobile device which utilizes a wireless communication interface. In the example of FIG. 1, a CMOS controller IC 12 is powered by a battery 11. The CMOS controller IC 12 controls a power amplifier (PA) 13 which amplifies an input RF signal to produce an output RF signal. An antenna apparatus 14 transmits the RF output signal across a wireless communication interface 15. The CMOS controller IC 12 includes a digital transmit enable input terminal (or input pin) 16, designated TX ENABLE. This transmit enable input is used to enable the CMOS controller IC 12 during the period of time (for example one-eighth of the time) in which the device is actively communicating via the wireless link 15, and to disable the CMOS controller IC 12 during the period of time (for example seven-eighths of the time) in which the device is not actively communicating via the wireless link 15. As shown in FIG. 1, the CMOS controller IC 12 includes other digital input terminals (or pins) designated generally at 17. The digital input terminals illustrated at 16 and 17 receive input signals provided by a baseband processor IC in the mobile device.

If the baseband processor IC has been produced using deep submicron technology, then the input signal levels provided to the CMOS controller IC 12 at 16 and 17 can be as low as 1.2-1.7 volts. The battery 11 typically provides a power voltage in the range of 2.7-5.5 volts. The input pins at 16 and 17 typically drive into circuit structures such as inverters. However, a 1.2-1.7 volt input signal cannot be expected to cleanly switch an inverter circuit which operates from a 2.7-5.5 volt power supply. This means that the input inverters can be expected to exhibit leakage current, regardless of whether the transmit enable pin 16 is activated to enable the CMOS controller IC 12, or is inactivated to disable the CMOS controller IC 12. The current drawn by the controller 12 when inactivated is often referred to as standby current.

One conventional approach to the mismatch between the 1.2-1.7 volt input range and the 2.7-5.5 volt battery range is the use of a regulator to lower the effective supply voltage seen at the input inverters to a level around 1.5 volts. This can permit full on/off states to be achieved without leakage, but the regulator requires a relatively large amount of circuit area, and must also be on at all times, even when the transmit enable pin is deactivated. Thus, much or all of the leakage current that is saved by operation of the regulator must still be drawn to power operation of the regulator anyway.

Moreover, the digital inputs at 17 in FIG. 1 are typically non-deterministic in nature, which means that the digital high/low switching of the signals is not known during the period of time while the transmit enable signal is deactivated. Accordingly, the switching action of these pins while the controller 12 is disabled causes leakage currents during the switching, and these leakage currents are not addressed by the regulator approach described above.

Therefore, there is a need in the art to provide for reduction of leakage currents at IC inputs that receive very low voltage signals, without adversely impacting the overall supply current budget. There is also a need to reduce leakage currents due to non-deterministic input switching that occurs while the IC is disabled.

SUMMARY OF THE INVENTION

To address the above-discussed deficiencies of the prior art, it is a primary object of the present invention to provide a switch that is responsive to deactivation of an enable input to isolate an IC's functional circuitry from one of its power supply nodes, thereby eliminating power supply current when the IC is disabled.

Some embodiments avoid further unwanted current flow by providing a switch that is responsive to the enable input to selectively connect and disconnect the base of a reference voltage transistor to and from the transistor's grounded collector, which collector is defined by the substrate of the IC. Disconnecting the base from the grounded substrate/collector eliminates base current and thus prevents emitter-to-collector current flow through the transistor when the IC is disabled.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller"

means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
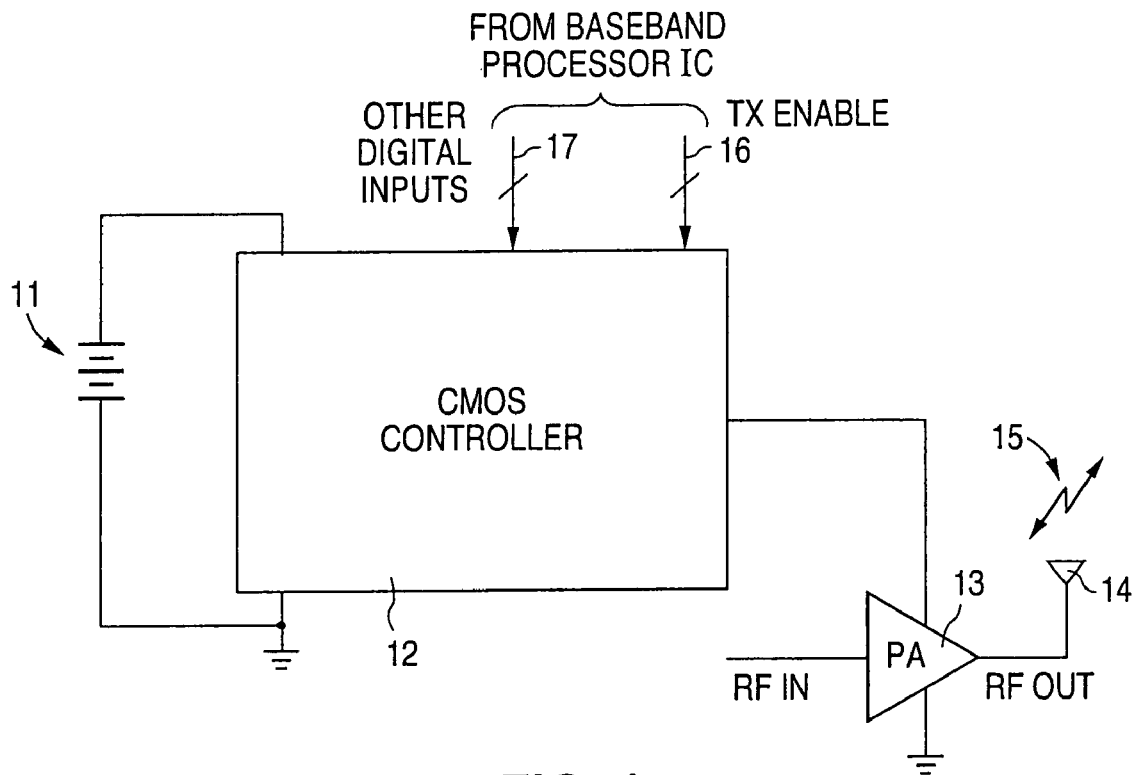
FIG. 1 diagrammatically illustrates a mobile data processing device according to the prior art.
Figure 3:
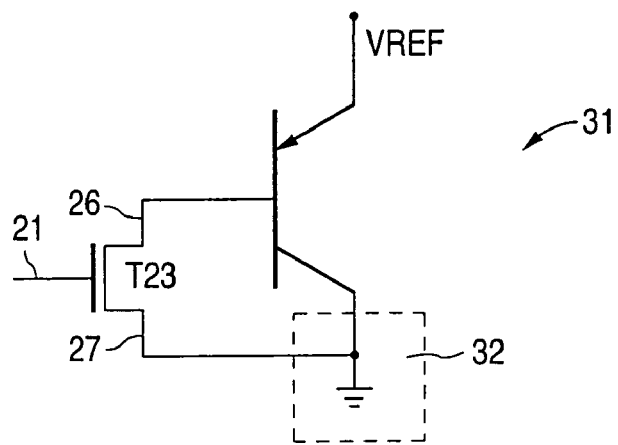
FIG. 3 illustrates a portion of FIG. 2 in more detail.
Figure 2:
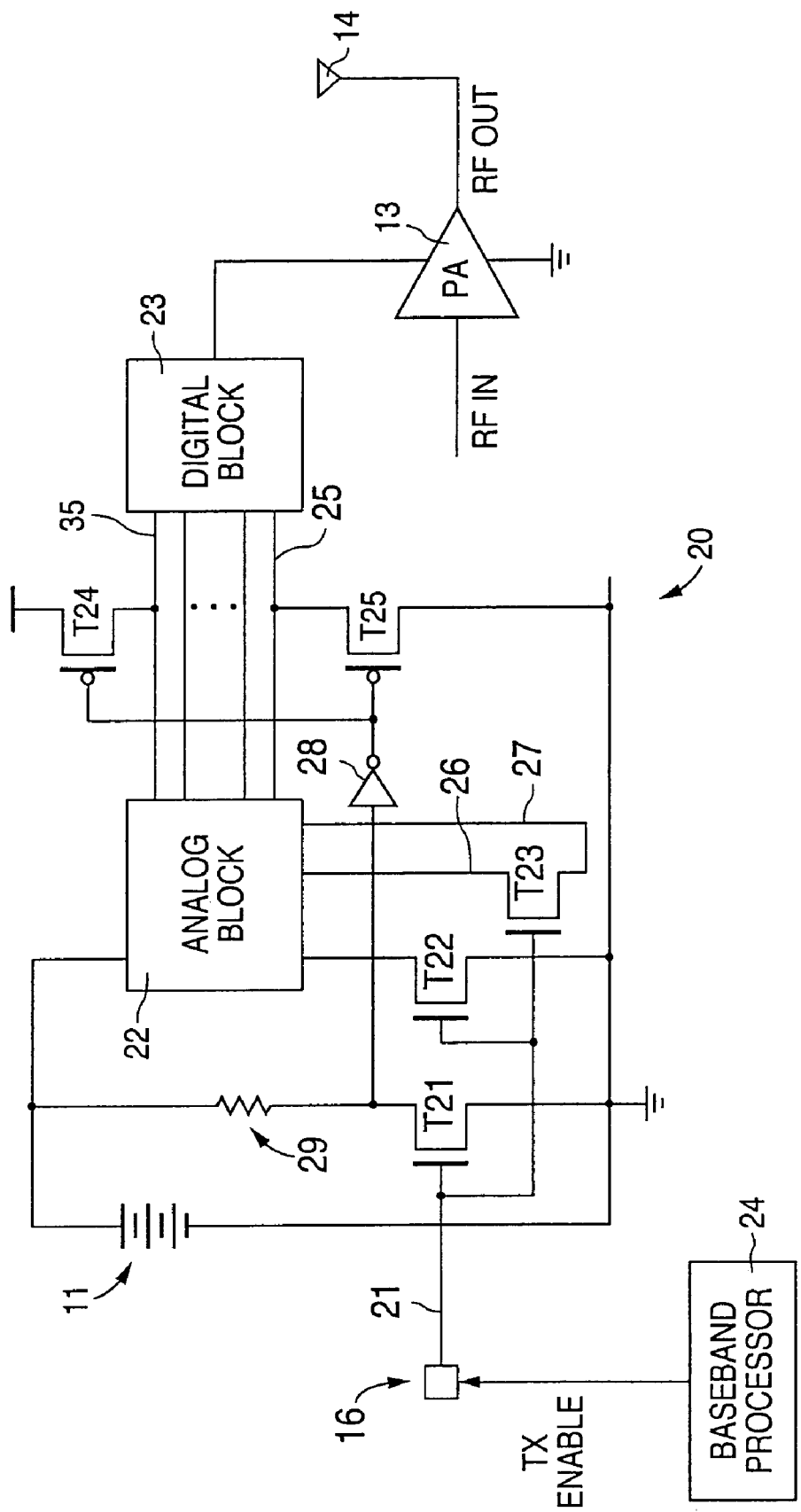
FIG. 2 diagrammatically illustrates exemplary embodiments of a mobile data processing device according to the present invention.

FIGS. 1 through 3, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

FIG. 2 diagrammatically illustrates exemplary embodiments of a mobile communication device according to the invention. FIG. 2 illustrates a CMOS controller IC 20 which is powered by a battery power supply 11 and which controls an RF power amplifier 13. The power amplifier controller circuitry includes an analog block 22, and a digital block 23 which is connected to the analog block and which directly controls the power amplifier 13. The IC 20 includes a transmit enable input terminal 16 that is physically accessible externally of the integrated circuit. The terminal (or pin) 16 receives a transmit enable signal (TX ENABLE) output from a baseband processor IC 24.

The enable input terminal 16 is connected at 21 to the gates of N-channel transistor switches T21, T22 and T23. The transistor T21 is connected in series between a pull up resistor 29 and ground. The transistor T22 is positioned for selectively connecting and disconnecting the analog block 22 to and from the battery ground. The transistor T23 is connected at 26 and 27 to a reference voltage circuit within the analog block 22. This will be described in more detail with respect to FIG. 3. An inverter 28 has an input connected to the pull up resistor 29 and the transistor T21, and has an output connected to the gates of P-channel transistor switches T24 and T25. Transistor T24 is connected to selectively pull a connection 35 between the analog block 22 and the digital block 23 up to the battery supply level, and transistor T25 is positioned to selectively pull another connection 25 between the analog block 22 and the digital block 23 down to the battery ground.

When the transmit enable signal TX ENABLE is deactivated to its logic low level, the power amplifier controller circuitry of the IC 20 is to be disabled. In response to a logic low level at the input terminal 16, N-channel transistors T21, T22 and T23 are turned off. With transistor T22 turned off, the analog block 22 is isolated from the battery ground. This shuts off all battery current paths through the analog block 22, so the analog block 22 does not draw any battery current and floats up to the battery voltage level.

The pull up resistor 29, N-channel transistor T21 and P-channel transistors T24 and T25 cooperate to eliminate "sneak paths" from the analog block 22 to the digital block 23. These sneak paths can occur because, for some high impedance nodes within the analog block 22, there is no guarantee that they will float up even when the transistor T22 isolates the analog block 22 from the battery ground. If any such node is coupled to the digital block 23, then that node could possibly discharge into circuitry in the digital block 23, thereby resulting in undesired operation of the digital circuitry. This undesired operation of the digital circuitry would draw unnecessary battery current.

Accordingly, in order to reduce standby current as much as possible, some embodiments provide pull up and/or pull down transistors (such as T24 and T25) to pull up and/or down any connection(s) between the analog block 22 and the digital block 23 that could possibly provide a discharge path into the digital block 23 from a high impedance node in the analog block 22. With T21 turned off, the input of inverter 28 is pulled up to the battery voltage by pull up resistor 29. The output of inverter 28 therefore goes low to turn on the P-channel transistors T24 and T25. In the example of FIG. 2, the transistor T25 is responsive to deactivation (logic low) of the transmit enable signal to pull down a connection 25 between the analog block 22 and the digital block 23, and the transistor T24 is responsive to deactivation of the transmit enable signal to pull up another connection 35 between the analog block 22 and the digital block 23. These pull up and pull down structures can prevent the high impedance nodes in the analog block 22 from discharging into the digital block 23. When the transmit enable signal is activated to a high logic level, the transistor T21 turns on, which brings the input of inverter 28 low. The output of inverter 28 therefore goes high to turn off the transistors T24 and T25 and float the connections 35 and 25, so that the analog block 22 and digital block 23 can interact normally while the integrated circuit 21 is enabled for operation.

FIG. 3 illustrates that the transistor T23 of FIG. 2 is connected at 26 and 27 to a reference voltage circuit within the analog block 22 of FIG. 2. As shown in the example of FIG. 3, the reference voltage circuit includes a diode-connectable. PNP transistor 31. The reference voltage VREF is the base-emitter voltage of the transistor 31. In a conventional N-well process, the grounded collector of the transistor 31 is defined by the substrate 32 of the integrated circuit, as illustrated by broken line in FIG. 3. Thus, the collector is not just connected to ground, but is literally defined by the grounded substrate. So it is physically impossible to "disconnect" the collector from ground, which makes it impossible to eliminate the current path through the transistor 31 from the emitter to the collector.

Therefore, the transistor T23 is provided to switchably connect the base of transistor 31 to the collector/substrate 32. When the transmit enable signal is activated to a logic high level at 21, the transistor T23 is turned on, and connects the base and collector to produce a diode connected PNP transistor that provides the reference voltage VREF. However, when the transmit enable signal is deactivated to a logic low level, the transistor T23 is turned off. Although the current path from the emitter to the collector of the transistor 31 remains intact, the disconnection of the base from the substrate/collector 32 (i.e., from ground) insures that there is no base current, so the transistor will not conduct current through the current path from emitter to collector.

Referring again to FIG. 2, the N-channel transistor T22 is large enough to accommodate the power supply current requirements of the analog block 22 during its normal operation. In some exemplary embodiments, the analog block 22 requires anywhere from 10 to 30 milliamps of battery current. In some embodiments, the N-channel transistors T21,T22 and T23 have an input threshold of 0.7V+/−0.2V.

Although the present invention has been described with exemplary embodiments, various changes and modifications may be suggested to one skilled in the art. It is intended that the present invention encompass such changes and modifications as fall within the scope of the appended claims.

What is claimed is:

1. An integrated circuit, comprising:
   an enable input terminal that is physically accessible externally of the integrated circuit;
   first and second power supply nodes;
   functional circuitry that can perform a desired operation, said functional circuitry coupled to said first and second power supply nodes and coupled to said enable input terminal;
   said enable input terminal receiving an enable signal that is activated when said functional circuitry is to be enabled to perform said desired operation and is deactivated when said functional circuitry is to be disabled from performing said desired operation; and
   a first switch coupled between said functional circuitry and one of said power supply nodes, said first switch having a control input coupled to said enable input terminal, said first switch isolating said functional circuitry from said one power supply node in response to deactivation of said enable signal and coupling said functional circuitry to said one power supply node in response to activation of said enable signal,
   wherein said functional circuitry includes a reference voltage circuit that provides a reference voltage, said reference voltage circuit including a transistor having a collector defined by a substrate of the integrated circuit and having a base, the integrated circuit further including a second switch connected between said base and said collector, said second switch having a control input coupled to said enable input terminal, said second switch disconnecting said base from said collector in response to deactivation of said enable signal and connecting said base to said collector in response to activation of said enable signal.

2. The integrated circuit of claim 1, wherein the functional circuitry includes analog circuitry, the integrated circuit further including a third switch coupled between a first node of the analog circuitry and the first power supply node and between a second node of the analog circuitry and the second power supply node, the third switch having a control input coupled to the enable input terminal, and the third switch pulling the first node of the analog circuit toward a first voltage at the first power supply node and pulling the second node of the analog circuit toward a second voltage at the second power supply node in response to deactivation of the enable signal and floating the first and second nodes of the analog circuit in response to activation of the enable signal.

3. The integrated circuit of claim 2, wherein the functional circuitry includes digital circuitry and wherein the first and second nodes of the analog circuitry are coupled to the digital circuitry.

4. The integrated circuit of claim 2, including a fourth switch coupled between the first and second power supply nodes, the fourth switch having a control input coupled to the enable input terminal, and the fourth switch coupled to the control input of the third switch.

5. The integrated circuit of claim 2, wherein the first switch includes an N-channel transistor, the second switch includes an N-channel transistor, and the third switch includes a P-channel transistor.

6. The integrated circuit of claim 2, wherein said one of said power supply nodes is a ground node.

7. The integrated circuit of claim 2, wherein the first switch includes an N-channel transistor.

8. A mobile data processing apparatus, comprising:
   a first integrated circuit including an enable input terminal that is physically accessible externally of the first integrated circuit, first and second power supply nodes, functional circuitry that can perform a desired operation, the functional circuitry coupled to the first and second power supply nodes, and coupled to the enable input terminal;
   a second integrated circuit having an output coupled to the enable input terminal;
   the enable input terminal receiving from the second integrated circuit an enable signal that is activated when the functional circuitry is to be enabled to perform the desired operation and is deactivated when the functional circuitry is to be disabled from performing the desired operation; and
   the first integrated circuit including a first switch coupled between the functional circuitry and one of the power supply nodes, the first switch having a control input coupled to the enable input terminal, the switch isolating the functional circuitry from the one power supply node in response to deactivation of the enable signal and coupling the functional circuitry to the one power supply node in response to activation of the enable signal,
   wherein the functional circuitry includes analog circuitry, the first integrated circuit further including a second switch coupled between a first node of the analog circuitry and one of the power supply nodes, the second switch having a control input coupled to the enable input terminal, and the second switch pulling the first node of the analog circuit toward a voltage at the one power supply node in response to deactivation of the enable signal and floating the first node of the analog circuit in response to activation of the enable signal.

9. The apparatus of claim 8, provided as one of a portable computer and a portable telephone.

10. The apparatus of claim 8, including a power amplifier coupled to the first integrated circuit for, under control of the functional circuitry of the first integrated circuit, amplifying a communication signal for transmission across a wireless communication interface.

11. The apparatus of claim 10, wherein the communication signal is a time division multiple access signal.

12. The apparatus of claim 8, wherein:
   the second switch is further coupled between a second node of the analog circuitry and the other one of the power supply nodes, and the second switch pulling the second node of the analog circuit toward a voltage at the other power supply node in response to deactivation of the enable signal and floating the second node of the analog circuit in response to activation of the enable signal; and
   the functional circuitry includes a reference voltage circuit that provides a reference voltage, the reference voltage circuit including a transistor having a collector defined by a substrate of the integrated circuit and having a base, the first integrated circuit further including a third switch connected between the base and the collector, the third switch having a control input coupled to the enable input terminal, the third switch disconnecting the base from the collector in response to deactivation of the enable signal and connecting the base to the collector in response to activation of the enable signal.

13. The apparatus of claim 8, wherein the functional circuitry includes digital circuitry and wherein the first node of the analog circuitry is coupled to the digital circuitry.

14. The apparatus of claim 8, including a fourth switch coupled between the first and second power supply nodes, the fourth switch having a control input coupled to the enable input terminal, and the fourth switch coupled to the control input of the second switch.

15. The apparatus of claim 8, wherein the first switch includes an N-channel transistor, the second switch includes an P-channel transistor, and the third switch includes a N-channel transistor.

16. The apparatus of claim 8, wherein said one of said power supply nodes is a ground node.

17. The apparatus of claim 8, wherein the first switch includes an N-channel transistor.

18. A method for use in an integrated circuit including first and second power supply nodes and functional circuitry including analog circuitry, the method comprising:

isolating the functional circuitry of the integrated circuit from one of the power supply nodes in response to a first state of an enable signal;

coupling the functional circuitry of the integrated circuit to the one of the power supply nodes in response to a second state of the enable signal;

pulling a first node of the analog circuit toward a first voltage at the first power supply node in response the second state of the enable signal; and floating the first node of the analog circuit in response to the first state of the enable signal.

19. The method of claim 18, wherein the integrated circuit further includes a transistor having a base and having a collector defined by a substrate of the integrated circuit, the method further comprising:

disconnecting the base of the transistor from the collector of the transistor in response to the first state of the enable signal; and connecting the base of the transistor to the collector of the transistor in response to the send state of the enable signal.

20. The method of claim 19, further comprising:

pulling a second node of the analog circuit toward a second voltage at the second power supply node in response the second state of the enable signal; and floating the second node of the analog circuit in response to the first state of the enable signal.

\* \* \* \* \*